: US 9,188,756 B2
(45) Date of Patent: *Nov. 17, 2015

(12) United States Patent
Register, III et al.

(54) HYBRID CABLE WITH FIBER-OPTIC AND CONDUCTOR ELEMENTS

(71) Applicant: Corning Cable Systems LLC, Hickory, NC (US)

(72) Inventors: James Arthur Register, III, Hickory, NC (US); David Henry Smith, Hickory, NC (US)

(73) Assignee: CORNING CABLE SYSTEMS LLC, Hickory, NC (US)

( * ) Notice: Subject to any disclaimer, the term of this patent is extended or adjusted under 35 U.S.C. 154(b) by 28 days.

This patent is subject to a terminal disclaimer.

(21) Appl. No.: 13/778,919

(22) Filed: Feb. 27, 2013

(65) Prior Publication Data

US 2014/0064681 A1 Mar. 6, 2014

Related U.S. Application Data

(60) Provisional application No. 61/680,011, filed on Aug. 6, 2012.

(51) Int. Cl.
  G02B 6/44 (2006.01)
  H01B 7/18 (2006.01)
  H05K 9/00 (2006.01)

(52) U.S. Cl.
  CPC ............... *G02B 6/4416* (2013.01); *H01B 7/18* (2013.01); *H05K 9/00* (2013.01)

(58) Field of Classification Search
  CPC .... G02B 6/4416; G02B 6/3817; G02B 6/443; H01B 11/22
  USPC ......... 385/100, 101, 102, 103, 104, 105, 106, 385/107
  See application file for complete search history.

(56) References Cited

U.S. PATENT DOCUMENTS

| | | | |
|---|---|---|---|
| 5,325,457 A | 6/1994 | Bottoms, Jr. et al. | 385/113 |
| 5,651,081 A | 7/1997 | Blew et al. | 385/101 |
| 5,917,977 A | 6/1999 | Barrett | 385/101 |

(Continued)

FOREIGN PATENT DOCUMENTS

| | | | |
|---|---|---|---|
| CN | 102222546 A | 10/2011 | H01B 11/22 |
| CN | 202067602 U | 12/2011 | H01B 11/22 |

(Continued)

OTHER PUBLICATIONS

Nexans, "Outdoor hybrid cables (unshielded)," Retrieved on Jun. 23, 2014 from http://wvvw.nexans.fr/eservice/France-en/pdf-family_9444/Outdoor_hybrid_cables_unshielded_.pdf—3 pages.

(Continued)

*Primary Examiner* — Jennifer Doan
(74) *Attorney, Agent, or Firm* — William D. Doyle

(57) ABSTRACT

A hybrid cable includes a cable jacket, elements stranded within the cable jacket, and armor between the elements and the cable jacket. The armor is configured to provide electromagnetic interference shielding and grounding as well as crush and impact resistance for the hybrid cable. The elements include electrical-conductor elements and one or more fiber-optic elements. The electrical-conductor elements include a metallic conductor jacketed in a polymer, where the electrical-conductor elements are each within the range of 10 American wire gauge (AWG) to 1\0 AWG. The one or more fiber-optic elements include optical fibers within a polymeric tube. At least six of the elements are stranded side-by-side with one another around a central element, which is one of the electrical-conductor elements or one of the one or more fiber-optic elements.

14 Claims, 2 Drawing Sheets

(56) References Cited

U.S. PATENT DOCUMENTS

| | | | |
|---|---|---|---|
| 6,195,487 B1 | 2/2001 | Anderson et al. | 385/101 |
| 6,236,789 B1 | 5/2001 | Fitz | 385/101 |
| 6,738,547 B2 | 5/2004 | Spooner | 385/101 |
| 7,310,430 B1 * | 12/2007 | Mallya et al. | 382/101 |
| 7,643,713 B2 | 1/2010 | Büthe et al. | 385/101 |
| 8,285,095 B2 | 10/2012 | Han et al. | 385/101 |
| 2002/0001441 A1 | 1/2002 | Avellanet | 385/104 |
| 2008/0037941 A1 | 2/2008 | Mallya et al. | 385/101 |
| 2012/0008904 A1 | 1/2012 | Han et al. | 385/101 |
| 2012/0281953 A1 | 11/2012 | Choi et al. | 385/101 |
| 2013/0287348 A1 | 10/2013 | Register, III et al. | 385/101 |
| 2013/0294735 A1 * | 11/2013 | Burris et al. | 385/101 |
| 2014/0064680 A1 * | 3/2014 | Register et al. | 385/101 |
| 2014/0064681 A1 | 3/2014 | Register, III et al. | 385/101 |

FOREIGN PATENT DOCUMENTS

| | | | | |
|---|---|---|---|---|
| CN | 202093884 U | 12/2011 | | H01B 11/22 |
| CN | 202134260 U | 2/2012 | | H01B 9/00 |

OTHER PUBLICATIONS

D.L. Collado, B.G. Risch, D.J. Yamasaki, J.D. Gustitus, & J.R. Sach, "Technical Considerations for Composite Cables in Fiber-To-The-Antenna (FTTA) Applications," Copyright 2013, *Proceedings of the 62$^{nd}$ International Wire & Cable Symposium Conference,* pp. 670-678; Retrieved on Jun. 20, 2014; Available at http://iwcs.omnibooksonline.com/data/papers/2013/14-1.pdf.

Draka, "ezMOBILITY™ Solutions," Copyright 2011, pp. 1-4; Retrieved on Jun. 20, 2014; Available at http://www.truenorthtech.com/pdf/ezMOBILITY%20Brochure.pdf.

Draka & Prysmian, "4G Hybrid Cable: Solution for FTTA Wireless Applications," Copyright 2014, pp. 1-2; Retrieved on Jun. 20, 2014; Available at http://na.prysmiangroup.com/en/business_markets/markets/telecom-solutions/resources/datasheets/500D_DS303_4G_FTTA_WIRELESS_0514.pdf.

* cited by examiner

HYBRID CABLE WITH FIBER-OPTIC AND CONDUCTOR ELEMENTS

RELATED APPLICATIONS

This application claims the benefit of priority under 35 U.S.C. §119 of U.S. Provisional Application Ser. No. 61/680,011 filed on Aug. 6, 2012, the content of which is relied upon and incorporated herein by reference in its entirety.

BACKGROUND

Aspects of the present disclosure relate generally to hybrid cables that include both fiber-optic and conductor elements, which may be stranded together for use in fiber-to-the-antenna (FTTA) type applications.

Cellular service providers may deploy Remote Radio Head (RRH) solutions throughout their antenna networks, a process that involves locating power radio frequency (RF) amplifiers at the top of the antenna (e.g., cell tower; radio tower; cell site). Remote Radio Head (RRH) solutions accordingly require cabling arrangements that deliver both power for the amplifiers and the high bandwidth capabilities of a fiber cable. Handling and routing of multiple cables, such as separate power cables and fiber optic cables, may be cumbersome, and may result in redundant armoring and jacketing as well as wasted space in ducts or other routing guides between the base and top of an antenna tower. A need exists for a hybrid cable arrangement that combines electrical conductors with fiber optic cables under a single cable jacket in a space-efficient manner, while still providing low attenuation of the optical fibers carried by the optical elements of the cable.

SUMMARY

One embodiment relates to a hybrid cable, which includes a cable jacket, elements stranded within the cable jacket, and armor between the elements and the cable jacket. The armor is configured to provide electro-magnetic interference shielding and grounding as well as crush and impact resistance for the hybrid cable. The elements include electrical-conductor elements and one or more fiber-optic elements. The electrical-conductor elements include a metallic conductor jacketed in a polymer, where the electrical-conductor elements are each within the range of 10 American wire gauge (AWG) to 1\0 AWG. The one or more fiber-optic elements include optical fibers within a polymeric tube. At least six of the elements are stranded side-by-side with one another around a central element, which is one of the electrical-conductor elements or one of the one or more fiber-optic elements.

Another embodiment relates to a hybrid cable, which includes a cable jacket and elements stranded within the cable jacket. The elements include electrical-conductor elements and one or more fiber-optic elements. The electrical-conductor elements include a metallic conductor jacketed in a polymer, and the one or more fiber-optic elements include optical fibers within a polymeric tube. At least six of the elements are stranded around a central element that is one of the electrical-conductor elements. The at least six of the elements and the central element are round in cross-section and have a diameter that is within 15% of the diameter of the largest one of the diameters of the at least six of the elements and the central element.

Yet another embodiment relates to a hybrid cable, which includes a cable jacket, elements stranded within the cable jacket, and armor between the elements and the cable jacket. The armor is configured to provide electro-magnetic interference shielding and grounding as well as crush and impact resistance for the hybrid cable. The elements include electrical-conductor elements and one or more fiber-optic elements. The electrical-conductor elements include a metallic conductor jacketed in a polymer, where the electrical-conductor elements are each within the range of 10 American wire gauge (AWG) to 1\0 AWG. The one or more fiber-optic elements include optical fibers within a polymeric tube. At least six of the elements are stranded around a central element that is one of the electrical-conductor elements, and the at least six of the elements and the central element are round in cross-section, having a diameter that is within 15% of the diameter of the largest one of the diameters of the at least six of the elements and the central element.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE FIGURES

The accompanying Figures are included to provide a further understanding, and are incorporated in and constitute a part of this specification. The drawings illustrate one or more embodiments, and together with the Detailed Description serve to explain principles and operations of the various embodiments. As such, the disclosure will become more fully understood from the following Detailed Description, taken in conjunction with the accompanying Figures, in which.

DETAILED DESCRIPTION

Before turning to the Figures, which illustrate exemplary embodiments in detail, it should be understood that the present inventive technology is not limited to the details or methodology set forth in the Detailed Description or illustrated in the Figures. For example, as will be understood by those of ordinary skill in the art, features and attributes associated with embodiments shown in one of the Figures may be applied to embodiments shown in others of the Figures.

Hybrid cables (e.g., cables of FIGS. 1-2 disclosed herein) include electric-conductor and fiber-optic elements stranded (e.g., helically wound) for enhanced performance of associated optical fibers as well as overall cable flexibility, where the electric-conductor elements are relatively-high capacity conductors ranging from 10 AWG to 1/0 AWG (i.e., about 5.26-53.5 $mm^2$ area, about 2.588-8.252 mm diameter, about 3.86-1.21 turns of wire per cm, and about 3.277-0.3224 $\Omega$/km for stranded wires, or the equivalent). Typically such heavy conductors may not be stranded due to the associated forces required to bend and constrain the conductors, and/or because stranding adds length, increasing cable manufacturing expenses due to material costs (e.g., copper conductors). However, Applicants have found that stranding the fiber optic subunits with the conductors provides a robust hybrid cable, with improved data transmission via less attenuation of the optical fibers.

Aspects of the present disclosure relate to the placement and size of the individual stranded elements of the hybrid cables in order to improve the cost, size, and data-transmission performance of the cable. Stable hybrid cable cores, due to stranding as well as the placement and size of the stranded elements as disclosed herein, also contribute to improved long-term performance, weather-ability, and stability of the cable due to enhanced mechanical coupling between the stranded elements.

Figure 1:
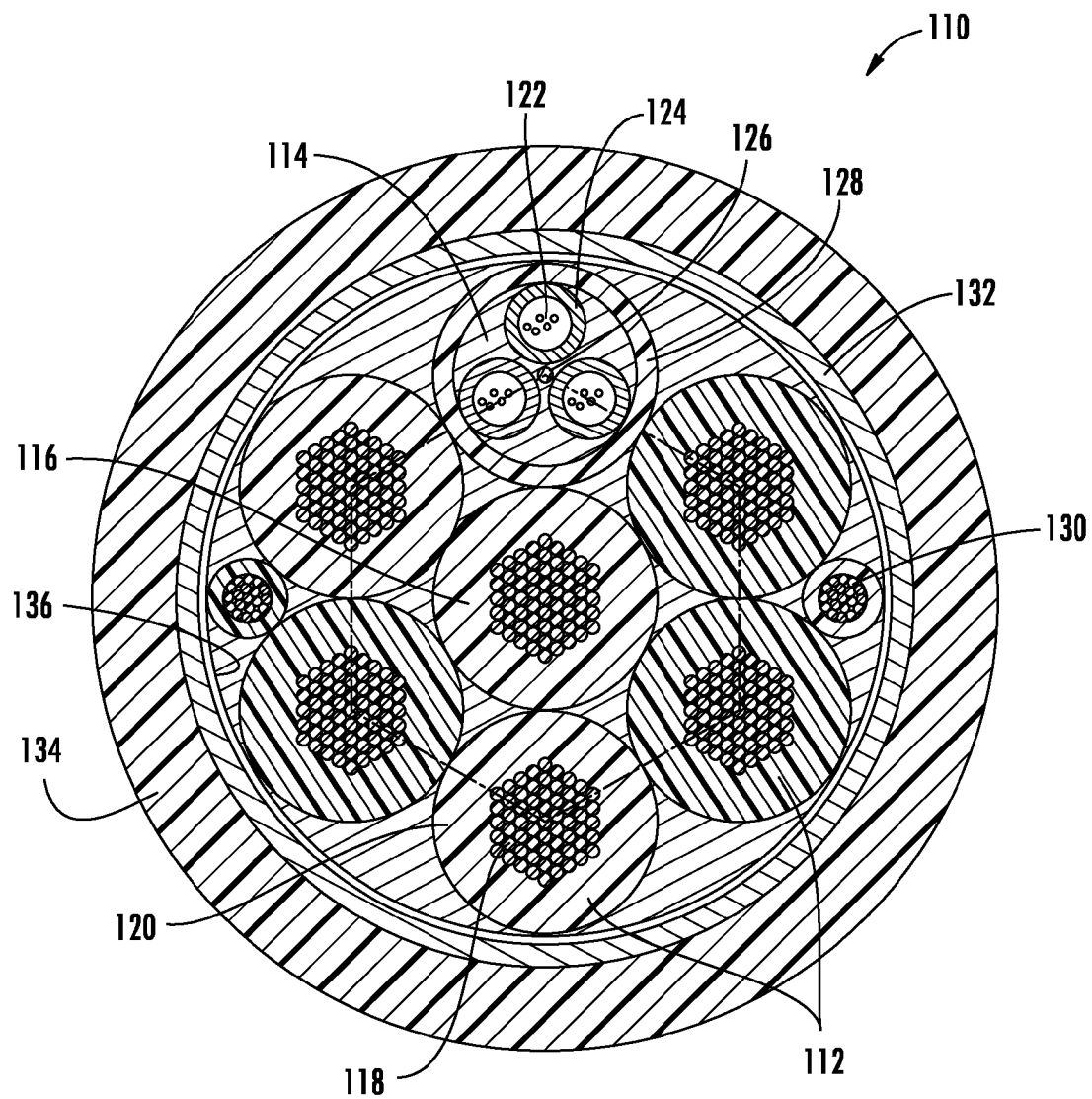
FIG. 1 is a sectional view of a hybrid cable according to an exemplary embodiment.

Referring to FIG. 1, a hybrid cable 110 includes elements 112, 114 stranded around a central element 116. The elements 112, 114 include stranded copper conductors 118 (e.g., 8 AWG) insulated in polyvinyl chloride (PVC) jackets 120 (or another polymeric material, such as fire-retardant (FR) polyethylene (PE)). In some embodiments, the diameter of the cable 110 (i.e., outer diameter of the radial cross-section, as shown in FIG. 1) is less than 20 mm due to the efficient arrangement of internal cable components, but may also be greater than 10 mm. The central element 116 (e.g., central member) of the cable 110 provides a surface for stranding the elements 112, 114, and also includes optical fibers 122 in buffer tubes 124 stranded about a rod 126 within a polymeric tube 128 (e.g., outdoor-rated PVC jacket).

According to an exemplary embodiment, aramid yarn or other strength members may be included within the tube 128. Alarm wires 130 may be positioned in the interstitial spaces between stranded elements 112, 114, and armor 132 surrounds the stranded elements 112, 114. According to an exemplary embodiment, the alarm wires 130 include two 18 AWG alarm conductors, which may carry an alarm signal; such as if connected antenna hardware requires maintenance. The alarm wires 130 may carry other signals instead or in addition thereto. According to an exemplary embodiment, the armor 132 may be a corrugated steel, copper, or aluminum armor, which also serves as a ground conductor and/or an electro-magnetic interference (EMI) shield. In other embodiments, the armor 132 may be dielectric.

Exterior to the armor 132, the cable 110 of FIG. 1 includes a polymeric jacket 134 (e.g., polyethylene, flare-retardant polyvinyl chloride, medium density polyethylene, zero-halogen polymer, outdoor polyvinyl chloride). In various alternate embodiments, the conductors 114, 116 are relatively high-capacity conductors, in the range of 10 AWG to 1\0 AWG (e.g., 8 gauge, 6 gauge), providing a large electrical capacity for powerful electrical equipment (e.g., cell site, radar, FTTA applications), as well as providing axial strength to the cable.

Aspects of the present disclosure relate to the particular efficient placements and uses of the stranded elements 112, 114 and structure of the cable 110, as opposed to the general concept of a hybrid cable containing both optical fibers and conductors. For example, stranding of the elements 112, 114 of about the same size as one another and in close proximity to one another, as disclosed herein, may provide for improved cable 110 flexibility, as well as improved performance of the optical fibers 122 (e.g., less attenuation than un-stranded cables).

According to an exemplary embodiment, spacing between stranded elements 112, 114, positioned adjacent to the central element 116 (e.g., contacting, within 10 microns of), is designed to provide a robust cable structure. According to an exemplary embodiment, a polygon (see dashed hexagon in FIG. 1) may be defined as passing through the centers of adjoining elements 112, 114, stranded about the central element 116. The exteriors of the elements 214 are spaced apart from one another at the narrowest distance by an average distance of separation of at least 2% of the total periphery of the polygon, but less than 20% of the periphery (i.e., gap or spacing between stranded elements is between 2-20%), preferably less than 15%, such as 12% or less; where 'average' distance refers to the net space of all gaps between adjoining stranded elements 112, 114 divided by the total number of adjoining stranded elements (such as all six elements 112, 114 around the central element 116 as shown in FIG. 1). Such spacing provides for enough room to account for inaccuracies in tolerances of the sizing of the elements (e.g., subtle changes in diameter) so that the stranded elements 112, 114 fit easily together, without radially loading one another; as well as provides for stable positioning, reducing the ability of the stranded elements 112, 114 to shift or migrate within the jacket, especially when the cable 110 is bending.

The cable 110 of FIG. 1 may further include one or more fiber-optic elements 112 and electrical-conductor elements 114 in the insulator jacket 120 (e.g., dielectric, PVC) stranded about the central element 116, with a water blocking yarn (not shown) therebetween. The optical fibers 122 are contained in the tube 128 (e.g., the tube mostly consisting of medium density polyethylene or polyvinyl chloride). Exterior to the stranded elements 114,116, the cable 110 includes a water-blocking tape 136, surrounded by the armor 132, in turn surrounded by a polymeric jacket 134.

According to an exemplary embodiment, a hybrid cable 110 includes at least six electrical-conductor elements 112 stranded about a central element, which may be an fiber optic element (see, e.g., fiber optic element 114 as shown in FIG. 1). In other embodiments, the central element 116 is an electrical-conductor element, as shown in FIG. 1.

According to an exemplary embodiment, the elements 112, 114, 116 of FIG. 1 share a common diameter (e.g., within reasonable tolerances; e.g., within 10% of one another). According to an exemplary embodiment, the tube 128, containing optic fibers 122 and stranded about the central element 116, has a diameter within a range of +10% to −20% of the diameter shared by the adjoining electrical conductor elements 112. Sizing the elements 112, 114, 116, and especially the stranded elements 112, 114, to match one another, improves the robustness of the hybrid cable 110 by reducing the volume of interstitial space within the cable 110, and correspondingly reducing the volume of space available for migration of the stranded elements 112, 114.

Figure 2:
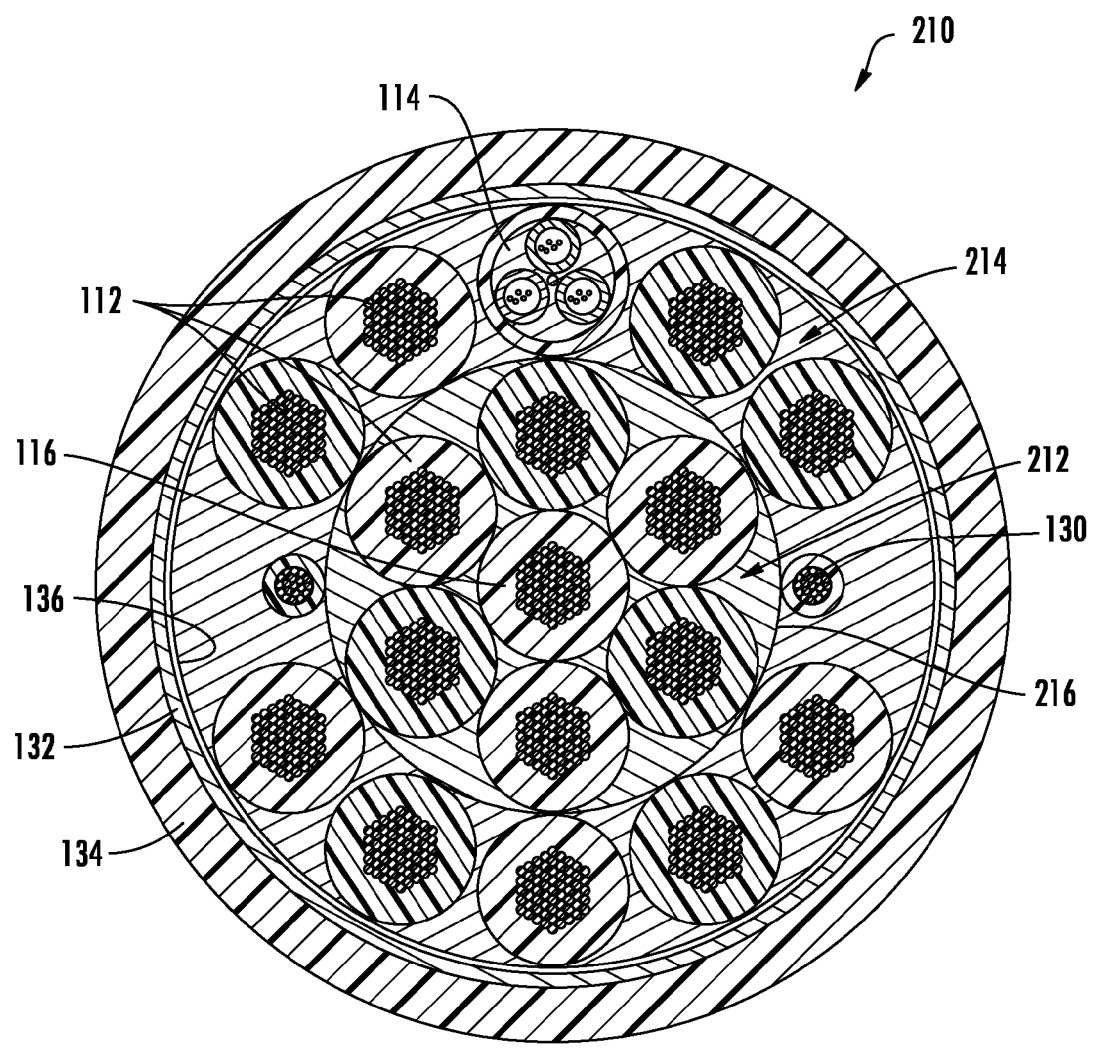
FIG. 2 is a sectional view of a hybrid cable according to another exemplary embodiment.

Referring now to FIG. 2, a hybrid fiber optic cable 210 includes first and second layers 212, 214 of stranded elements 112, 114. The first layer 212 of stranded elements 112 are stranded about a central member 116 (e.g., electrical-conductive element, fiber-optic element, glass-reinforced plastic rod). Surrounding the first layer 212, a water-swellable tape and/or a binder 216 at least partially fills the interstitial space. The second layer 214 includes additional stranded elements 112, 114. According to an exemplary embodiment, the second layer 214 includes more stranded elements 112, 114 than the first layer 212. In other contemplated embodiments, a third layer correspondingly includes still more elements 112, 114 than the second layer 214, and so forth. The fiber-optic elements 114 may be positioned in the exterior-most layer (e.g., layer 214), providing ease of access thereto when opening the cable 210.

According to an exemplary embodiment, the lay length of the stranded elements 112, 114 of cable 210, and/or any of the other cables disclosed herein, is between 350-450 mm, providing a good empirically-derived balance between element length, cable flexibility, and low-attenuation of optical fibers. Further, the second layer 214 is stranded in an opposite direction to the first layer 212 (or mostly so for S-Z stranding of either or both layers), which avoids interstitial conversion of the layers 212, 214 that may increase attenuation due to extra bending of optical fibers carried in the fiber-optic elements 114. The optical fibers may be multi-mode fibers, but single-mode fibers may also or alternatively be included. Furthermore, the optical fibers may be loosely placed in buffer tubes (as shown in FIGS. 1-2), tight-buffered, or even a ribbon or stacked ribbons of optical fibers.

According to an exemplary embodiment, the cable 210 is greater than 30 mm in diameter, but less than 40 mm in diameter due to the compact configuration of stranded elements 112, 114; and includes ten 6 AWG conductors, as well as three 12-fiber buffer tubes. Two 18 AWG conductors 130 and/or filler rods may be positioned within the interstitial spaces surrounding the first layer 212, above or below the tape and/or binder 216. According to an exemplary embodiment, water-blocking tape 136, armor 132, and a polymeric jacket 134 surround the second layer 214.

According to an exemplary embodiment, cables 110, 210 include a number of electrical-conductor elements 112 (e.g., ten or six 6-gauge thermoplastic high heat-resistant nylon-coated (THHN) conductors) having a diameter (e.g., less than 7 mm diameter; about 6.3 mm diameter) that is approximately equal to that diameter of a number of fiber optic elements 114 also included in the cable. According to an exemplary embodiment, the difference in diameters of the stranded elements 112, 114 is less than 50% of the diameter of the largest of the diameters (e.g., less than 25%, less than 10%), or less than twice the diameter of the smallest of the diameters (e.g., less than 1.5 times; less than 1.25 times). In some embodiments, the fiber optic elements 114 contain multiple optical fibers, such as 36 or 24 fibers net. Standard THHN 6-gauge copper conductors have diameters nearly matching those of standard-size buffer tubes of 12-fiber MIC® Cables manufactured by Corning Cable Systems, which may serve as the electrical-conductor and fiber-optic elements 112, 114 respectively. In other embodiments, machine tool wire (MTW) (more insulated than THHN) conductors may be used.

Closely sizing the electrical-conductor and fiber-optic elements 112, 114 provides for a uniform shape and well-balanced, stranded cable 110, 210, which in turn improves the performance of the associated optical fibers 122. According to an exemplary embodiment, single-mode optical fibers of the cables 110, 210 shown in FIGS. 1-2 or variations thereof, have an attenuation of 0.4 dB/km (or less) for 1310 nm wavelength and of 0.3 dB/km (or less) for 1550 nm wavelength in the stranded configuration of the respective cables 110, 210. Such low attenuation is believed to be a significant improvement over hybrid cables that are un-stranded, particularly when the cables are in bending. In other embodiments, the hybrid cables 110, 210 may include multi-mode fibers and/or multi-core fibers.

In some embodiments, the stranded elements 112, 114 are helically stranded, while in other embodiments the elements are S-Z stranded (or a combination thereof, between different layers 212, 214). Preferably, the larger diameter elements 112 (e.g., 2 AWG or 1/0 AWG THHN or MTW) for larger cables (e.g., at least 30 mm in diameter) are helically stranded, due at least in part to reduced lateral loading by the elements 112 upon the jacket 134 within the cable 110, 210, which allows for a thinner jacket 134. Other embodiments may be S-Z stranded, especially those of smaller diameters (e.g., less than 30 mm in diameter) and associated components.

Applicants have discovered that sizing the diameters of the fiber-optic elements 114 to be close in size to that of the electrical-conductor elements 112 allows for improved stranding of both elements 112, 114 about the central element 116. In a preferred embodiment, the stranded elements 112, 114 are stranded in groups of about seven mod six (e.g., 7, 13, 19, 25, . . . with one of the elements in the center) or one mod five, which allows for a generally even distribution of the elements about the central element 116, with reduced shifting or asymmetry to the position of the elements 112, 114 in the cable 110, 210. In some embodiments, multiple layers 212, 214 of stranded elements 112, 114 are included in the cable 210, where the outer layers 214 are stranded about the inner layer(s) 212, and where the innermost layer 212 may be stranded about a central element 116 (e.g., spacer, guide).

Utilizing the described hybrid cable design features and design rules offers a number of advantages, including: (1) stable cable cores that allow for enhanced mechanical coupling between the cable elements, which should offer an improvement in long term cable stability in its installation environment; (2) the above-described features and techniques generally allow for a minimum-size cable cross-section, while containing the requisite stranded elements, where smaller cables are less expensive to make—particularly when considering the cost of an overall armor/shield; and (3) data transmission via optical performance will be improved relative to cables that do not include stranded elements, particularly around bends in the cable due at least in part to reduced tension of the optical fibers. Further, use of either an optical element 114 or an electrical-conductive element 112 as the central element 116 further condenses the cable 110, 210, improving efficiency of space, where the electrical-conductive elements 112 and/or armor 132 (which may not be included in some embodiments) additionally serve as strength members for the cable in tension or compression.

The construction and arrangements of the hybrid cable, as shown in the various exemplary embodiments, are illustrative only. Although only a few embodiments have been described in detail in this disclosure, many modifications are possible (e.g., variations in sizes, dimensions, structures, shapes, and proportions of the various elements, values of parameters, mounting arrangements, use of materials, colors, orientations, etc.) without materially departing from the novel teachings and advantages of the subject matter described herein. Some elements shown as integrally formed may be constructed of multiple parts or elements, the position of elements may be reversed or otherwise varied, and the nature or number of discrete elements or positions may be altered or varied. The order or sequence of any process, logical algorithm, or method steps may be varied or re-sequenced according to alternative embodiments. Other substitutions, modifications, changes and omissions may also be made in the design, operating conditions and arrangement of the various exemplary embodiments without departing from the scope of the present inventive technology.

What is claimed is:
1. A hybrid cable, comprising:
a cable jacket; and
elements stranded within the cable jacket, wherein the elements comprise:
   electrical-conductor elements comprising a metallic conductor jacketed in a polymer;
   one or more fiber-optic elements comprising optical fibers within a polymeric tube; and
wherein at least six of the elements are stranded around a central element that is one of the electrical-conductor elements; and
wherein the at least six of the elements and the central element are round in cross-section and have a diameter that is within 15% of the diameter of the largest one of the diameters of the at least six of the elements and the central element.

2. The hybrid cable of claim 1, wherein more than six of the elements are stranded around the at least six of the elements stranded side-by-side with one another around the central element.

3. The hybrid cable of claim 2, wherein the one or more fiber-optic elements are included in the more than six of the elements stranded around the at least six of the elements stranded side-by-side with one another around the central element.

4. The hybrid cable of claim 1, wherein the central element is one of the electrical-conductor elements.

5. The hybrid cable of claim 4, wherein the electrical-conductor elements are each within the range of 10 American wire gauge (AWG) to 1\0 AWG.

6. The hybrid cable of claim 1, wherein the at least six of the elements and the central element are round in cross-section and have a diameter that is within 5% of the diameter of the largest one of the diameters of the at least six of the elements and the central element.

7. The hybrid cable of claim 1, wherein each of the one or more fiber-optic elements comprises buffer tubes stranded about a central strength member and positioned within the tube of the respective fiber-optic element, and wherein the optical fibers of the respective fiber-optic element are positioned inside the buffer tubes.

8. A hybrid cable, comprising:
a cable jacket;
elements stranded within the cable jacket; and
armor between the elements and the cable jacket, wherein the armor is configured to provide electro-magnetic interference shielding and grounding as well as crush and impact resistance for the hybrid cable;
wherein the elements comprise:
electrical-conductor elements comprising a metallic conductor jacketed in a polymer, wherein the electrical-conductor elements are each within the range of 10 American wire gauge (AWG) to 1\0 AWG;
one or more fiber-optic elements comprising optical fibers within a polymeric tube; and
wherein at least six of the elements are stranded around a central element that is one of the electrical-conductor elements; and
wherein the at least six of the elements and the central element are round in cross-section and have a diameter that is within 15% of the diameter of the largest one of the diameters of the at least six of the elements and the central element.

9. The hybrid cable of claim 8, wherein the central element is one of the electrical-conductor elements.

10. The hybrid cable of claim 8, wherein the at least six of the elements and the central element are round in cross-section and have a diameter that is within 5% of the diameter of the largest one of the diameters of the at least six of the elements and the central element.

11. The hybrid cable of claim 8, wherein each of the one or more fiber-optic elements comprises buffer tubes stranded about a central strength member and positioned within the tube of the respective fiber-optic element, and wherein the optical fibers of the respective fiber-optic element are positioned inside the buffer tubes.

12. The hybrid cable of claim 8, further comprising a water-blocking tape surrounding the elements, between the elements and the armor.

13. The hybrid cable of claim 8, wherein more than six of the elements are stranded around the at least six of the elements stranded side-by-side with one another around the central element.

14. The hybrid cable of claim 13, wherein the one or more fiber-optic elements are included in the more than six of the elements stranded around the at least six of the elements stranded side-by-side with one another around the central element.

* * * * *